United States Patent
Park et al.

(10) Patent No.: US 9,214,484 B2
(45) Date of Patent: Dec. 15, 2015

(54) IMAGE SENSOR PACKAGES

(71) Applicant: Samsung Electronics Co., Ltd., Suwon-Si, Gyeonggi-Do (KR)

(72) Inventors: Ok-Gyeong Park, Yongin-si (KR); Min-Ok Na, Bucheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/450,864

(22) Filed: Aug. 4, 2014

(65) Prior Publication Data

US 2015/0130011 A1 May 14, 2015

(30) Foreign Application Priority Data

Nov. 13, 2013 (KR) .................. 10-2013-0137746

(51) Int. Cl.
*H01L 23/28* (2006.01)
*H01L 27/146* (2006.01)

(52) U.S. Cl.
CPC . *H01L 27/14618* (2013.01); *H01L 2224/48091* (2013.01); *H01L 2224/49175* (2013.01)

(58) Field of Classification Search
CPC ............... H01L 27/14618; H01L 2224/48091; H01L 2224/49175
See application file for complete search history.

(56) References Cited

FOREIGN PATENT DOCUMENTS

| JP | 2003-125295 A | 4/2003 |
| JP | 2003-142616 A | 5/2003 |
| JP | 2004-200629 A | 7/2004 |
| KR | 10-2003-0025696 A | 3/2003 |
| KR | 10-1210039 A | 9/2007 |

*Primary Examiner* — Long Pham
(74) *Attorney, Agent, or Firm* — Harness, Dickey & Pierce, P.L.C.

(57) ABSTRACT

An image sensor package may include: a package substrate including a chip attachment area on an upper surface thereof, a pad area having a plurality of pads around the chip attachment area, and a holder attachment area at an outside of the pad area, wherein an upper surface of the holder attachment area is at a lower level than an upper surface of the pad area; an image sensor chip mounted on the chip attachment area of the package substrate; a transparent member above the package substrate and configured to cover the image sensor chip; and a holder on the holder attachment area of the package substrate and configured to fix the transparent member.

17 Claims, 7 Drawing Sheets

IMAGE SENSOR PACKAGES

CROSS-REFERENCE TO RELATED APPLICATION(S)

This application claims priority from Korean Patent Application No. 10-2013-0137746 filed on Nov. 13, 2013, in the Korean Intellectual Property Office (KIPO), the disclosure of which is hereby incorporated by reference in its entirety.

BACKGROUND

1. Field

Some example embodiments of the inventive concepts may relate to image sensor packages. Some example embodiments of the inventive concepts may relate to electronic systems including the image sensor packages.

2. Description of Related Art

As applications of image sensor packages are diversified, the image sensor packages may be required to have a structure capable of reducing a package size and/or improving reliability.

SUMMARY

Some example embodiments of the inventive concepts may provide image sensor packages capable of improving reliability of the packages.

Some example embodiments of the inventive concepts may provide image sensor packages capable of reducing sizes of the packages.

In some example embodiments, an image sensor package may comprise: a package substrate including a chip attachment area on an upper surface thereof, a pad area having a plurality of pads around the chip attachment area, and a holder attachment area at an outside of the pad area, wherein an upper surface of the holder attachment area is at a lower level than an upper surface of the pad area; an image sensor chip mounted on the chip attachment area of the package substrate; a transparent member above the package substrate and configured to cover the image sensor chip; and a holder on the holder attachment area of the package substrate and configured to fix the transparent member.

In some example embodiments, the holder attachment area of the package substrate may include a stepped portion along edges of the upper surface of the package substrate.

In some example embodiments, the image sensor package may further comprise: at least one concave-convex pattern on an upper surface of the stepped portion.

In some example embodiments, the stepped portion may have a trench structure.

In some example embodiments, the image sensor package may further comprise: an adhesive layer between the holder attachment area of the package substrate and the holder.

In some example embodiments, an upper surface of the adhesive layer may be at a lower level than the upper surface of the pad area.

In some example embodiments, the image sensor package may further comprise: a plurality of connecting members electrically connecting the image sensor chip and the plurality of pads of the package substrate.

In some example embodiments, an image sensor package may comprise: a package substrate including a plurality of pads on an upper surface thereof, and a stepped portion along edges of the upper surface at outsides of the pads; an image sensor chip mounted on the upper surface of the package substrate; a transparent member above the package substrate and configured to cover the image sensor chip; and a holder having a lower end attached to the stepped portion of the package substrate, and configured to fix the transparent member.

In some example embodiments, a width of the stepped portion may be the same as a width of the lower end of the holder.

In some example embodiments, the stepped portion may have a same width and depth along the edges of the upper surface of the package substrate.

In some example embodiments, the image sensor package may further comprise: at least one concave-convex pattern on an upper surface of the stepped portion.

In some example embodiments, the image sensor package may further comprise: an adhesive layer between the lower end of the holder and the stepped portion of the package substrate.

In some example embodiments, an upper surface of the adhesive layer may be at a lower level than the upper surface of the package substrate.

In some example embodiments, a package substrate may comprise: a chip attachment area in which an image sensor chip is mounted; and a peripheral area including pads electrically connected to the image sensor chip. The peripheral area may include a stepped portion at outsides of the pads.

In some example embodiments, the stepped portion may be along edges of an upper surface of the package substrate.

In some example embodiments, a package substrate may comprise: an inner area; an image sensor chip mounted on the inner area; a second area that includes pads electrically connected to the image sensor chip; and an outer area that includes a stepped portion.

In some example embodiments, the second area may surround the inner area.

In some example embodiments, the outer area may surround the inner area.

In some example embodiments, the outer area may surround the second area.

In some example embodiments, a surface of the stepped portion may include concave-convex patterns.

In some example embodiments, the outer area may include a trench-type stepped portion.

In some example embodiments, a surface of the trench-type stepped portion may include concave-convex patterns.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
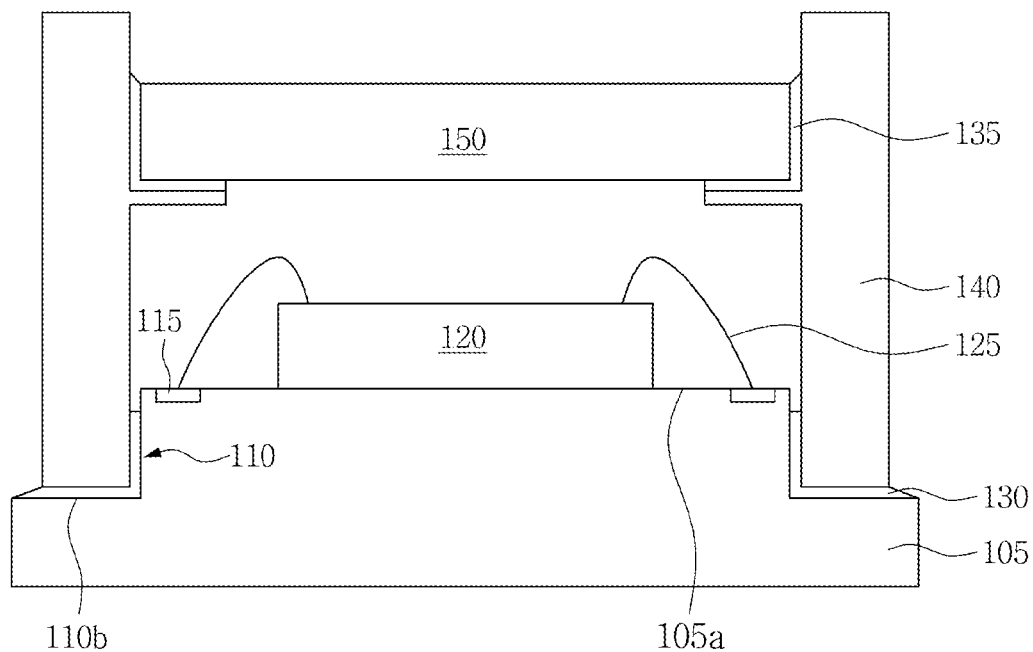
FIGS. 1 and 2 are a cross-sectional view and a perspective view showing an image sensor package in accordance with some example embodiments of the inventive concepts.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are riot intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 2:
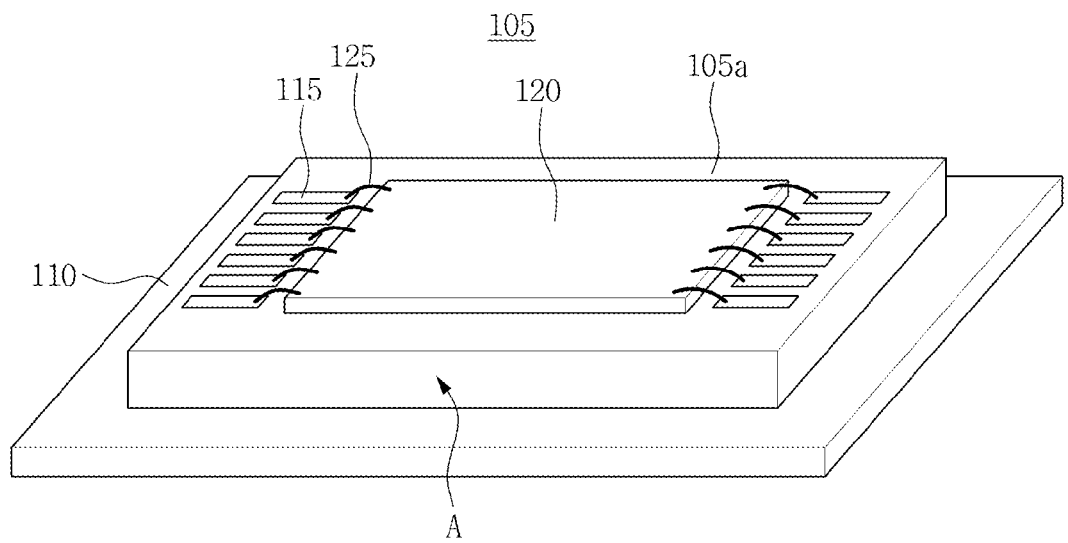

FIGS. 1 and 2 are a cross-sectional view and a perspective view showing an image sensor package in accordance with some example embodiments of the inventive concepts, respectively.

Referring to FIGS. 1 and 2, the image sensor package 100 in accordance with some example embodiments of the inventive concepts may include a package substrate 105, an image sensor chip 120, a transparent member 150, and a holder 140.

The image sensor chip 120 may be mounted on an upper surface 105a of the package substrate 105. The image sensor chip 120 may include a semiconductor device by which optical information is converted to an electrical signal, for example, a complimentary metal-oxide-semiconductor (CMOS) image sensor. The CMOS image sensor may include an active pixel area for capturing an image, and a CMOS logic area for controlling an output signal of the active pixel area. The active pixel area may be configured as a photo-diode and a metal-oxide-semiconductor CMOS) transistor, and the CMOS logic area may be configured as a plurality of CMOS transistors.

The package substrate 105 may include a chip attachment area on which the image sensor chip 120 is mounted, and a peripheral area that includes a plurality of pads 115 electrically connected to the image sensor chip 120. For example, the package substrate 105 may be a printed circuit board (PCB). The plurality of pads 115 may transmit electrical signals or supply voltages.

The image sensor chip 120 and the pads 115 of the package substrate 105 may he electrically connected through a plurality of connecting members 125, such as wires. The image sensor chip 120 may include a plurality of chip pads, which are connected to the pads 115 of the package substrate 105, on an active surface thereof. In addition, the image sensor chip 120 may be electrically connected to the package substrate 105 using a connecting member, such as through-vias.

The holder 140 may be arranged on the peripheral area of the package substrate 105 to surround the image sensor chip 120. The holder 140 may be attached to the package substrate 105 by a first adhesive layer 130, such as epoxy. The holder 140 may be configured to maintain uniformly the distance between the transparent member 150 and the image sensor chip 120.

The transparent member 150 may be fixed and supported by the holder 140. Accordingly, the transparent member 150 may be disposed above the package substrate 105 by the holder 140 and cover the image sensor chip 120. The transparent member 150 may be attached to the holder 140 by a second adhesive layer 135, such as epoxy. The distance between the transparent member 150 and the image sensor chip 120 may be determined by the height of the holder 140. The transparent member 150 may function as an optical filter, and include a transparent material, such as glass.

An image signal of light incident on the image sensor chip 120 through the transparent member 150 may be converted to an electrical signal in the image sensor chip 120, and the converted electrical signal may be transmitted to the package substrate 105 through the connecting members 125. The electrical signal transmitted to the package substrate 105 may be transmitted to various apparatuses or devices via an external connection terminal, etc.

Hereinafter, a package substrate 105 in accordance with some example embodiments of the inventive concepts will be described with reference to FIGS. 5A and 5B, in detail.

Figure 5A:
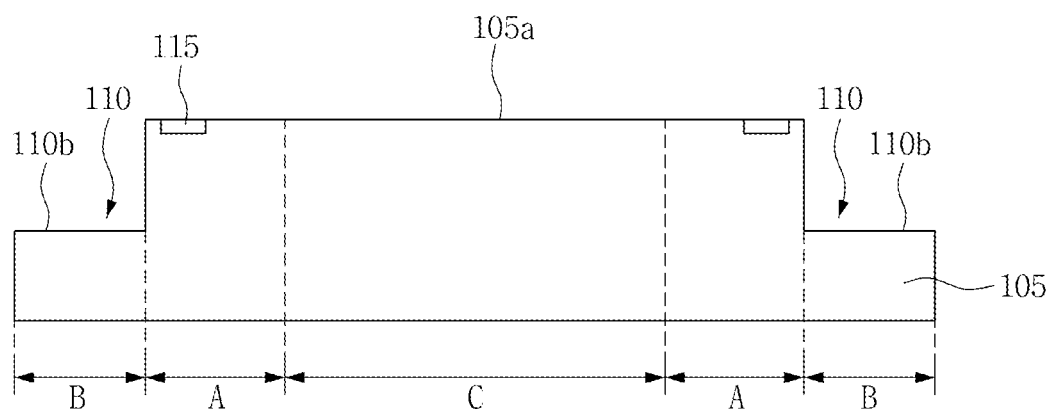
FIGS. 5A, 5B, 6, and 7 are cross-sectional views and a perspective view for describing a method of fabricating an image sensor package in accordance with some example embodiments of the inventive concepts.
Figure 5B:
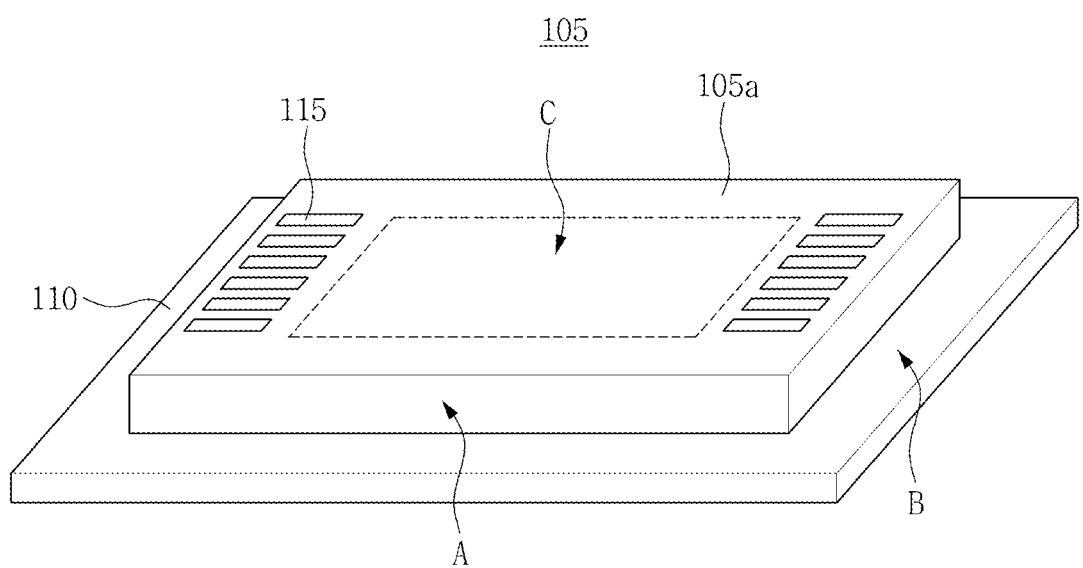

Referring to FIGS. 5A and 5B, a chip attachment area C, on which the image sensor chip 120 is mounted, may be disposed on a center of the upper surface 105a of the package substrate 105.

The peripheral area of the package substrate 105 may include a pad area A, configured as a plurality of pads 115 formed around the chip attachment area C, and a holder attachment area B, defined on an outside of the pad area A.

An upper surface 110b of the holder attachment area B may be located at a lower level than an upper surface of the pad area A.

According to some example embodiments of the inventive concepts, the holder attachment area B of the package substrate 105 may include a stepped portion 110 formed along edges of the upper surface 105a of the package substrate 105. The stepped portion 110 may be formed to have the same width as a lower end of the holder 140. The stepped portion 110 may be formed to have the same width and depth along the edges of the upper surface 105a of the package substrate 105.

The lower end of the holder 140 may be tightly combined with the stepped portion 110 of the holder attachment area B by the first adhesive layer 130.

The first adhesive layer 130 may be formed on bottom and side surfaces of the stepped portion 110. Since a side surface as well as a bottom surface of the lower end of the holder 140 is fixed on the stepped portion 110 of the holder attachment area B by the first adhesive layer 130, an adhesive area between the holder 140 and the package substrate 105 may increase.

According to an existing image sensor package, a holder is attached to a package substrate by forming a guide pin on a lower end of the holder and inserting the guide pin into the package substrate. Accordingly, there is a limit to reduce a thickness of the package substrate due to a height of the guide pin.

In contrast, according to some example embodiments of the image sensor package of the inventive concepts, since the holder 140 is adhered and fixed to the stepped portion 110 formed at the outside of the pad area A along the edges of the upper surface 105a of the package substrate 105, the adhesive area between the holder 140 and the package substrate 105 can increase. Since an adhesive strength increases as the adhesive area increases, the adhesive strength between the holder 140 and the package substrate 105 in accordance with some example embodiments of the inventive concepts can increase. Accordingly, shifting of the holder 140 from the package substrate 105 or peeling of the package substrate 105 can be prevented during a process of fabricating an image sensor package, and reliability of packages can be improved by enhancing a sealing effect of the image sensor chip 120.

In addition, since the holder 140 is attached to the stepped portion 110 on the package substrate 105 without using a guide pin, the thickness of the package substrate 105 can be reduced. Accordingly, light and thin products including the image sensor package can be implemented.

An upper surface of the first adhesive layer 130 formed on the bottom and side surfaces of the stepped portion 110 may be located at a lower level than the upper surface of the pad area A. Accordingly, since the first adhesive layer 130 does not flow into the pad area A, contamination of the pads 115 can be prevented. Further, the size of image sensor package can be reduced by reducing the distance between the holder 140 and the pad area A.

Figure 3:
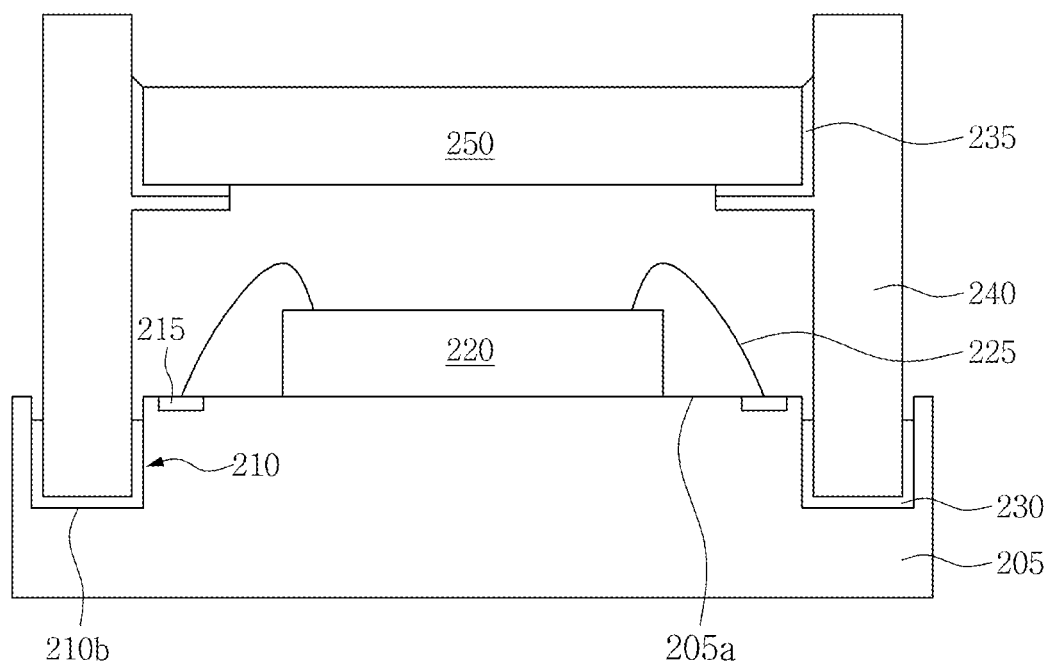
FIGS. 3 and 4 are a cross-sectional view and a top view showing an image sensor package in accordance with some example embodiments of the inventive concepts.
Figure 4:
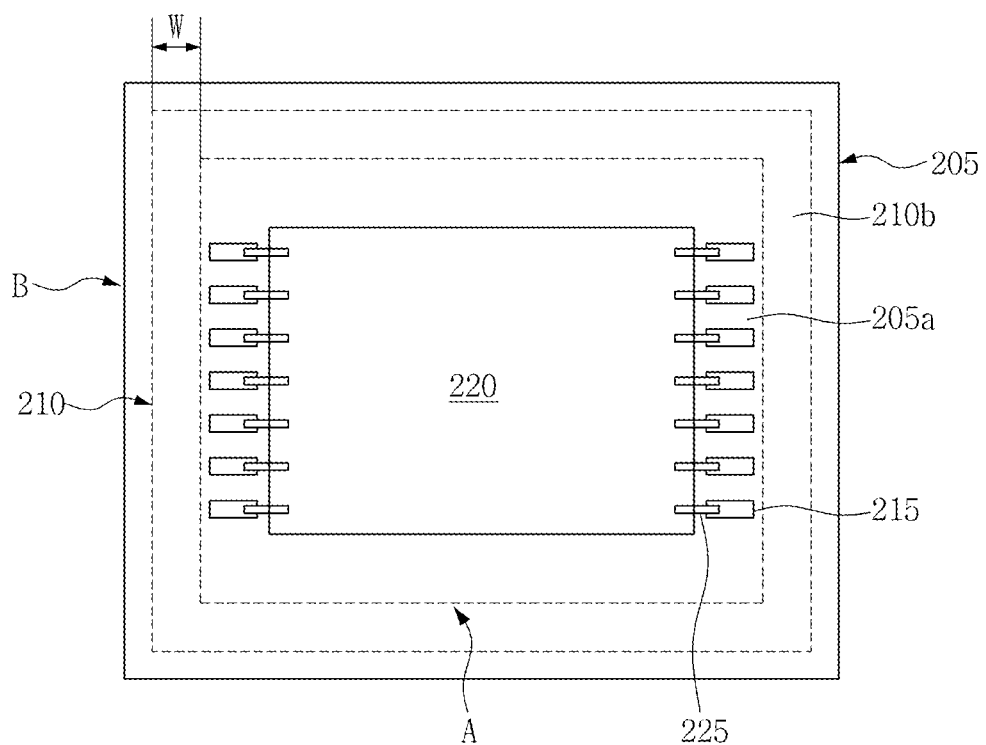

FIGS. 3 and 4 are a cross-sectional view and a top view showing an image sensor package in accordance with some example embodiments of the inventive concepts.

Referring to FIGS. 3 and 4, an image sensor package 200 in accordance with some example embodiments of the inventive concepts may include a package substrate 205, an image sensor chip 220 mounted on an upper surface 205a of the package substrate 205, a transparent member 250 covering the image sensor chip 220, and a holder 240 for fixing the transparent member 250.

The holder 240 may be attached to the package substrate 205 by a first adhesive layer 230 and to the transparent member 250 by a second adhesive layer 235.

The package substrate 205 may include a chip attachment area on which the image sensor chip 220 is mounted, and a peripheral area including a plurality of pads 215 electrically connected to the image sensor chip 220. The image sensor chip 220 and the pads 215 of the package substrate 205 may be electrically connected through a plurality of connecting members 225, such as wires.

A peripheral area of the package substrate 205 may include a pad area A configured as a plurality of pads 215 formed around the chip attachment area, and a holder attachment area B defined at an outside of the pad area A.

An upper surface 210b of the holder attachment area B may be located at a lower level than an upper surface of the pad area A.

According to some example embodiments of the inventive concepts, the holder attachment area B of the package substrate 205 may include a trench-type stepped portion 210 formed on four edges of the upper surface 205a of the package substrate 205. A lower end of the holder 240 may be tightly combined with the stepped portion 210 of the holder attachment area B by the first adhesive layer 230.

The stepped portion 210 may be formed to have a same width W as the lower end of the holder 240. The stepped portion 210 may be formed to have the same width and depth along the edges of the upper surface 205a of the package substrate 205.

The first adhesive layer 230 may be formed on bottom and side surfaces of the stepped portion 210. Since a side surface as well as a bottom surface of the lower end of the holder 240 is fixed on the stepped portion 210 of the holder attachment area B by the first adhesive layer 230, an adhesive area between the holder 240 and the package substrate 205 can increase. Accordingly, shifting of the holder 240 or peeling of the package substrate 205 can be prevented, and reliability of packages can be improved by enhancing a sealing effect of the image sensor chip 220.

In addition, since the holder 240 is attached to the stepped portion 210 of the package substrate 205, a thickness of the package substrate 205 can be reduced so as to embody light and thin products including the image sensor package.

An upper surface of the first adhesive layer 30 formed on the bottom and side surfaces of the stepped portion 210 may be located at a lower level than the upper surface of the pad area A. Accordingly, since the first adhesive layer 230 does not flow into the pad area A, contamination of the pads 215 can be prevented. Further, a size of the image sensor package can be reduced by reducing a distance between the holder 240 and the pad area A.

Figure 6:
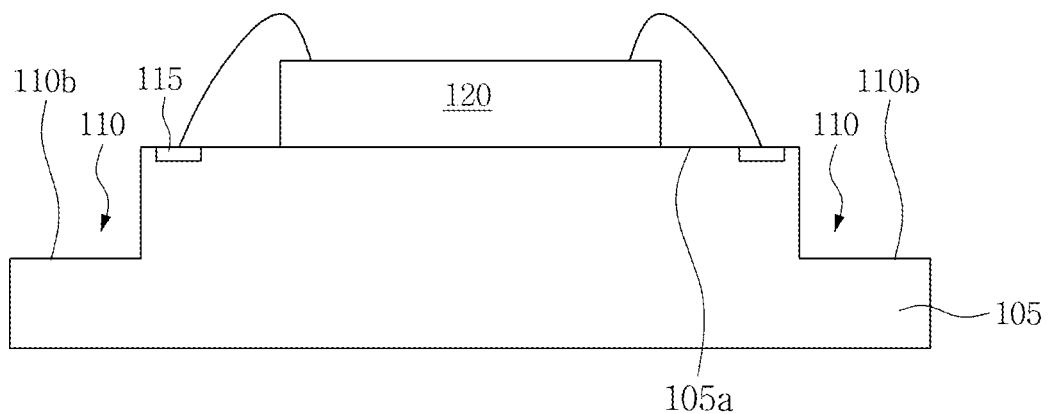
Figure 7:
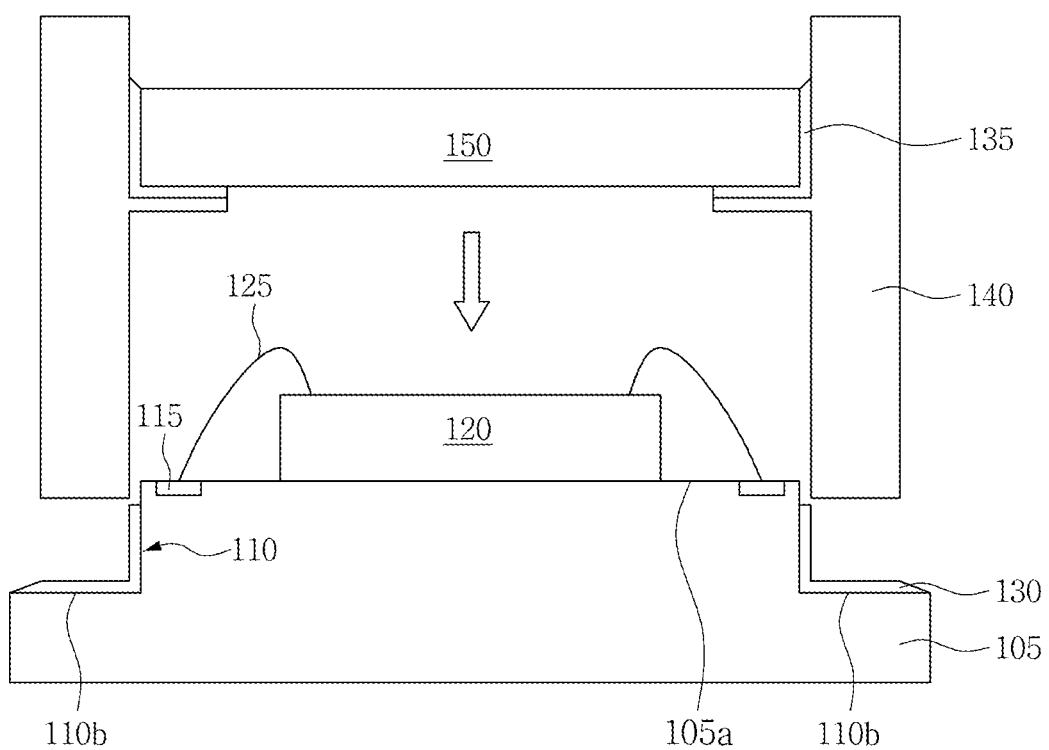

Hereinafter, a method of fabricating an image sensor package in accordance with some example embodiments of the inventive concepts will be described with reference to FIGS. 5A, 5B, 6, and 7. FIGS. 6 and 7 are cross-sectional views for describing a method of fabricating an image sensor package in accordance with some example embodiments of the inventive concepts.

First, a package substrate 105 as described in FIGS. 5A and 5B may be provided.

The package substrate 105 may be, for example, a PCB.

The package substrate 105 may include a chip attachment area C defined on an upper surface 105a thereof, a pad area A configured as a plurality of pads 115 formed around the chip attachment area C, and a holder attachment area B defined at an outside of the pad area A. The plurality of pads 115 may transmit electrical signals and supply voltages.

The holder attachment area B may include a stepped portion 110 formed along an edge of the upper surface 105a of the package substrate 105. Accordingly, an upper surface 110b of the holder attachment area B may be located at a lower level than an upper surface of the pad area A.

The stepped portion 110 may be variously modified in the process of fabricating the package substrate 105. The stepped portion 110 may be formed to have the same width and depth along the edge of the upper surface 105a of the package substrate 105.

Referring to FIG. 6, an image sensor chip 120 may be attached to the upper surface 105a of the package substrate 105 by interposing an adhesive film, such as epoxy.

The image sensor chip 120 may be mounted on the chip attachment area C of the package substrate 105. The image sensor chip 120 may include a light-receiving part and chip pads on an active surface thereof.

Next, a plurality of connecting members 125 electrically connecting the image sensor chip 120 and the pads 115 of the package substrate 105 may be formed. The connecting members 125 may be formed using a wire bonding process. For example, the connecting member 125 may include gold (Au).

Referring to FIG. 7, a first adhesive layer 130 may be formed on the holder attachment area B of the package substrate 105. The first adhesive layer 130 may be formed on bottom and side surfaces of the stepped portion 110. For example, the first adhesive layer 130 may he formed by injecting a liquid-state epoxy using a dispenser.

Next, a holder 140 to which a transparent member 150 is attached by a second adhesive layer 135, such as epoxy, etc., may be disposed on the holder attachment area B of the package substrate 105.

A process of hardening the first adhesive layer 130 may be performed in a state in which a lower end of the holder 140 is partly inserted into the stepped portion 110 of the holder attachment area B. That is, when a thermal compression or reflow process is performed in a state in which the lower end of the holder 140 is inserted to the depth corresponding to the height of the stepped portion 110, the image sensor package 100 is formed in such a way that the first adhesive layer 130 is hardened, and the lower end of the holder 140 is closely combined with the bottom and side surfaces of the stepped portion 110.

The first adhesive layer 130 may be formed before the holder 140 is inserted into the stepped portion 110 as described above, or in a state in which the holder 140 is inserted into the stepped portion 110. For example, the first adhesive layer 130 in a liquid state is inserted between the holder 140 and the stepped portion 110 of the package substrate 105 using a dispenser, and then hardened by performing the thermal compression or reflow process.

Figure 8:
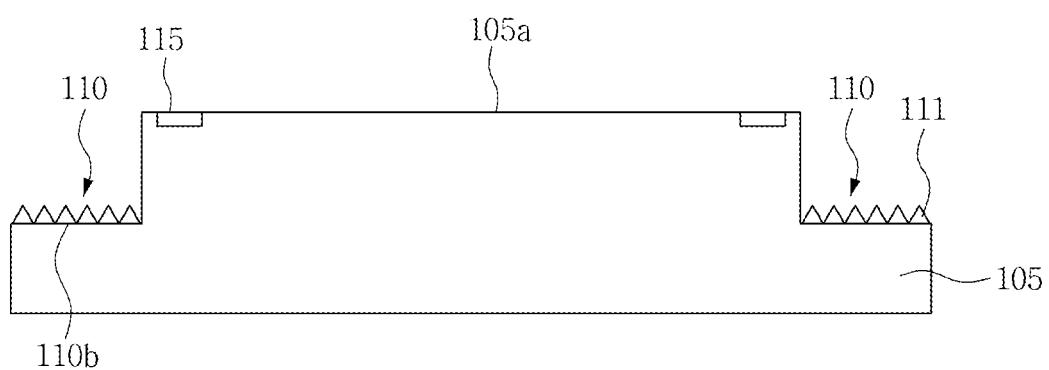
FIGS. 8 to 10 are cross-sectional views showing package substrates of image sensor packages in accordance with some example embodiments of the inventive concepts.
Figure 9:
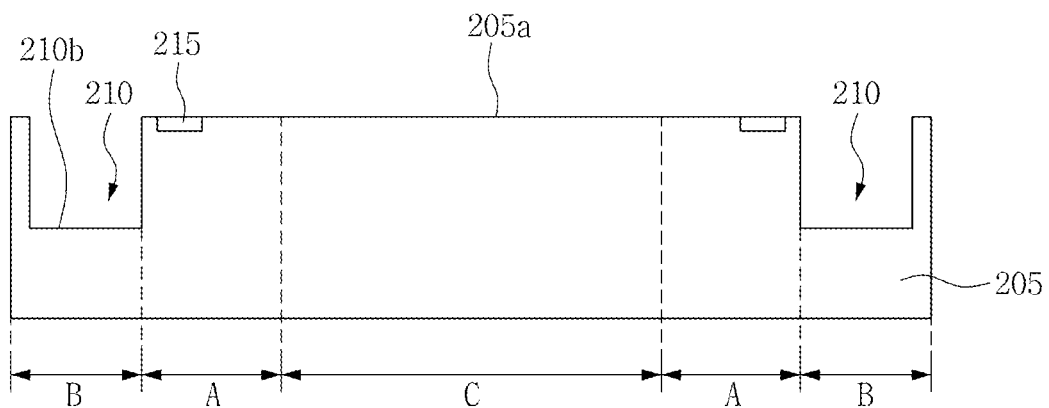
Figure 10:
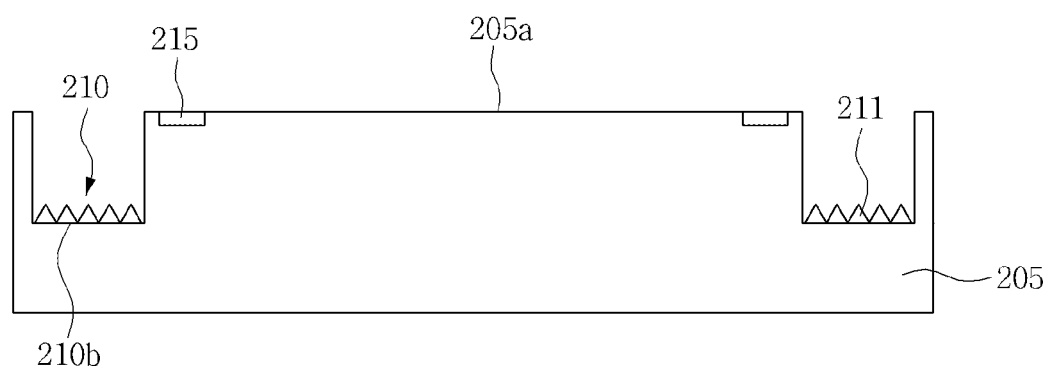

FIGS. 8 to 10 are cross-sectional views showing package substrates of image sensor packages in accordance with some example embodiments of the inventive concepts.

Referring to FIG. 8, a package substrate 105 of an image sensor package in accordance with some example embodiments of the inventive concepts may include concave-convex pattern 111 formed on an upper surface 110b of a stepped portion 110 thereof.

A cross-section of the concave-convex pattern 111 may have a regularly repeating shape, for example, a saw-tooth shape or a wave shape, but example embodiments of the inventive concepts are not limited thereto. In addition, the cross-section of the concave-convex pattern 111 may have an irregular shape.

There may be a chemical method and a physical method in the formation of the concave-convex pattern 111. As the chemical method, for example, the concave-convex pattern 111 may be formed by etching or corroding the bottom surface of the stepped portion 110 using a chemical agent. As the physical method, for example, the concave-convex pattern 111 may be formed on the entire surface of the stepped portion 110 using a sand blasting method. Otherwise, a desired shape of concave-convex pattern 111 may be formed on the bottom surface of the stepped portion 110 using an injection molding method.

Referring to FIG. 9, a package substrate 205 of an image sensor package in accordance with some example embodiments of the inventive concepts may include a chip attachment area C defined on an upper surface 205a thereof, a pad area A having a plurality of pads 215 formed around the chip attachment area C, and a holder attachment area B defined on an outside of the pad area A.

The holder attachment area B of the package substrate 205 may include a trench-type stepped portion 210 formed at four edges of an upper surface 205a of the package substrate 205.

Referring to FIG. 10, a package substrate 205 of an image sensor package in accordance with some example embodiments of the inventive concepts may include a trench-type stepped portion 210 formed at four edges of an upper surface 205a thereof, and concave-convex pattern 211 may be formed on an upper surface 210b of the stepped portion 210.

A cross-section of the concave-convex pattern 211 may have a regularly repeating shape, for example, a saw-tooth shape or a wave shape, but example embodiments of the inventive concepts are not limited thereto. In addition, the cross-section of the concave-convex pattern 211 may have an irregular shape. The concave-convex pattern 211 may be formed by an etching or corroding method using a chemical agent, a sand blasting method or an injection molding method.

Figure 11:
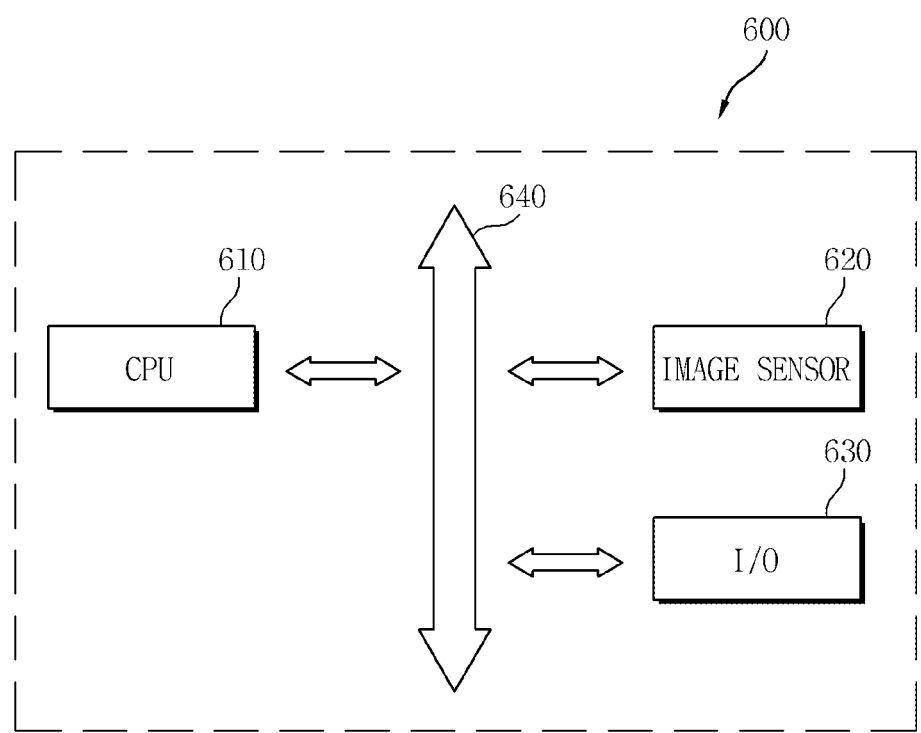
FIG. 11 is a block diagram of an electronic system including an image sensor package in accordance some example embodiments of the inventive concepts.

FIG. 11 is a schematic diagram showing an electronic system including an image sensor package in accordance with some example embodiments of the inventive concepts.

Referring to FIG. 11, an electronic system 600 may include a bus 640, an image sensor 620 capable of communicating by performing input/output (I/O) using the bus 640, a central processing unit (CPU) 610, and an input/output 630.

The image sensor 620 may include an image sensor package in accordance with some example embodiments of the inventive concepts.

The bus 640 may function to provide a passage through which data mutually receives/transmits among the CPU 610, the I/O 630, and the image sensor 620.

The CPU 610 may include at least one of a microprocessor, a digital signal processor, a micro-controller, and other logic devices capable of performing a similar function thereof.

The I/O 630 may include one of various input apparatuses, such as an operation button, a switch, a keyboard, a mouse, a keypad, a touch pad, a scanner, a camera, and an optical sensor, or one of an liquid crystal display (LCD), light-emitting diode (LED), and/or color picture tube (CPT) monitor, a printer, and/or a display apparatus capable of displaying a variety of visual information.

An application chipset, a camera image sensor (CIS), an I/O device, etc., may be additionally provided in the electronic system 600.

The electronic system 600 may be implemented as a mobile system, a personal computer, an industrial computer, or a logic system capable of performing various functions, etc. For example, the mobile system may be one of a personal digital assistant (PDA), a smart phone, a portable computer, a web tablet, a mobile phone, a wireless phone, a laptop computer, a memory card, a digital music system, and an information transmitting/receiving system.

When the electronic system 600 is an apparatus that performs wireless communication, the electronic system 600 may be used in a communication system, such as Code Division Multiple Access (CDMA), Global System for Mobile communication (GSM), North American Digital Cellular (NADC), Enhanced-Time Division Multiple Access (E-TDMA), Wideband Code Division Multiple Access (WCDMA), and CDMA2000.

Figure 12:
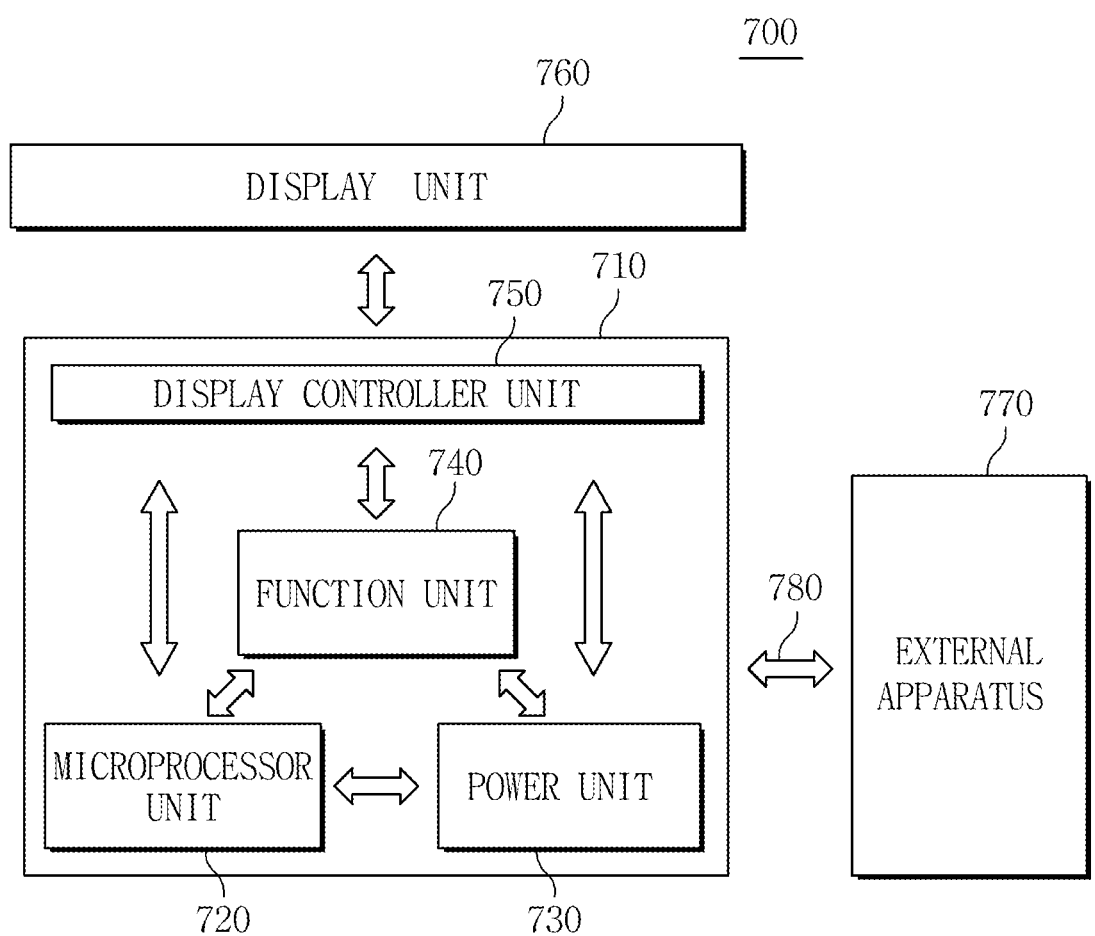
FIG. 12 is a block diagram showing an electronic system including an image sensor package in accordance some example embodiments of the inventive concepts.

FIG. 12 is a block diagram showing an electronic system including an image sensor package in accordance with some example embodiments of the inventive concepts.

Referring to FIG. 12, the electronic system 700 may include a body 710, a microprocessor unit 720, a power unit 730, a function unit 740, and a display controller unit 750. The microprocessor unit 720 and/or the function unit 740 may include an image sensor package in accordance with some example embodiments of the inventive concepts.

The body 710 may include a motherboard formed of a printed circuit board (PCB). The microprocessor unit 720, the power unit 730, the function unit 740, and the display controller unit 750, etc., may be installed on the body 710. A display unit 760 may be disposed in the body 710 or on a surface of the body 710. For example, the display unit 760 may be disposed on a surface of the body 710 to display an image processed by the display controller unit 750.

The power unit 730 may receive a constant voltage from an external battery (not shown), etc., divide the voltage into required levels of voltages, and supply those voltages to the microprocessor unit 720, the function unit 740, and the display controller unit 750, etc.

The microprocessor unit 720 may receive a voltage from the power unit 730 to control the function unit 740 and the display unit 760. The function unit 740 may perform various functions of the electronic system 700. For example, when the electronic system 700 is a mobile phone, the function unit 740 may have several components which perform functions of the mobile phone, such as output of an image to the display unit 760 or output of a voice to a speaker, by dialing or communication with an external apparatus 770. If a camera is installed, the function unit 740 may be a camera image processor.

For example, when the electronic system 700 is connected to a memory card, etc., in order to expand capacity, the function unit 740 may be a memory card controller. The function unit 740 may exchange signals with the external apparatus 770 through a wired or wireless communication unit 780. In addition, when the electronic system 700 needs a universal serial bus (USB), etc., in order to expand functionality, the function unit 740 may be an interface controller.

According to some example embodiments of the inventive concepts, a substrate of an image sensor package including a chip attachment area, a pad area, and a holder attachment area on an upper surface thereof, has a stepped portion formed at the holder attachment area. Therefore, an upper surface of the holder attachment area may be located at a lower level than an upper surface of the pad area. Accordingly, package reliability can be improved since contact area between the package substrate and a holder increases, and contamination of the pad can be prevented.

In addition, since the distance between the pad area and the holder is reduced on a plan view, the size of package can be reduced.

The foregoing is illustrative of some example embodiments and is not to be construed as limiting thereof. Although some example embodiments have been described, those skilled in the art will readily appreciate that many modifications are possible without materially departing from the novel teachings and advantages. Accordingly, all such modifications are intended to be included within the scope of this inventive concepts as defined in the claims. In the claims, means-plus-function clauses are intended to cover the structures described herein as performing the recited function, and not only structural equivalents but also equivalent structures.

It should be understood that example embodiments described herein should he considered in a descriptive sense only and not for purposes of limitation. Descriptions of features or aspects within example embodiments should typically be considered as available for other similar features or aspects in other example embodiments.

What is claimed is:

1. An image sensor package, comprising:
   a package substrate including a chip attachment area on an upper surface thereof, a pad area having a plurality of pads around the chip attachment area, and a holder attachment area at an outside of the pad area, wherein an upper surface of the holder attachment area is at a lower level than an upper surface of the pad area;
   an image sensor chip mounted on the chip attachment area of the package substrate;
   a transparent member above the package substrate and configured to cover the image sensor chip;
   a holder on the holder attachment area of the package substrate and configured to fix the transparent member; and
   an adhesive layer between the holder attachment area of the package substrate and the holder.

2. The image sensor package of claim 1, wherein the holder attachment area of the package substrate includes a stepped portion along edges of the upper surface of the package substrate.

3. The image sensor package of claim 2, further comprising:
    at least one concave-convex pattern on an upper surface of the stepped portion.

4. The image sensor package of claim 1, wherein the stepped portion has a trench structure.

5. The image sensor package of claim 1, wherein an upper surface of the adhesive layer is at a lower level than the upper surface of the pad area.

6. The image sensor package of claim 1, further comprising:
    a plurality of connecting members electrically connecting the image sensor chip and the plurality of pads of the package substrate.

7. An image sensor package, comprising:
    a package substrate including a plurality of pads on an upper surface thereof, and a stepped portion along edges of the upper surface at outsides of the pads;
    an image sensor chip mounted on the upper surface of the package substrate;
    a transparent member above the package substrate and configured to cover the image sensor chip;
    a holder having a lower end attached to the stepped portion of the package substrate, and configured to fix the transparent member; and
    at least one concave-convex pattern on an upper surface of the stepped portion.

8. The image sensor package of claim 7, wherein a width of the stepped portion is the same as a width of the lower end of the holder.

9. The image sensor package of claim 7, wherein the stepped portion has a same width and depth along the edges of the upper surface of the package substrate.

10. The image sensor package of claim 7, further comprising:
    an adhesive layer between the lower end of the holder and the stepped portion of the package substrate.

11. The image sensor package of claim 10, wherein an upper surface of the adhesive layer is at a lower level than the upper surface of the package substrate.

12. A package substrate, comprising:
    an inner area;
    an image sensor chip mounted on the inner area;
    a second area that includes pads electrically connected to the image sensor chip; and
    an outer area that includes a stepped portion, a surface of the stepped portion including concave-convex patterns.

13. The package substrate of claim 12, wherein the second area surrounds the inner area.

14. The package substrate of claim 12, wherein the outer area surrounds the inner area.

15. The package substrate of claim 12, wherein the outer area surrounds the second area.

16. The package substrate of claim 12, wherein the outer area includes a trench-type stepped portion.

17. The package substrate of claim 16, wherein a surface of the trench-type stepped portion includes concave-convex patterns.

* * * * *